(12) United States Patent
Tega et al.

(10) Patent No.: US 12,392,802 B2
(45) Date of Patent: Aug. 19, 2025

(54) CIRCUIT BOARD, PROBE CARD SUBSTRATE, AND PROBE CARD

(71) Applicant: KYOCERA Corporation, Kyoto (JP)

(72) Inventors: Hitoshi Tega, Kyoto (JP); Daisuke Jingu, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 728 days.

(21) Appl. No.: 17/780,058

(22) PCT Filed: Nov. 27, 2020

(86) PCT No.: PCT/JP2020/044277
§ 371 (c)(1),
(2) Date: May 26, 2022

(87) PCT Pub. No.: WO2021/107115
PCT Pub. Date: Jun. 3, 2021

(65) Prior Publication Data
US 2022/0413015 A1    Dec. 29, 2022

(30) Foreign Application Priority Data

Nov. 27, 2019  (JP) ................................. 2019-214387

(51) Int. Cl.
*G01R 1/073* (2006.01)
*H05K 1/02* (2006.01)
*H05K 1/03* (2006.01)

(52) U.S. Cl.
CPC ....... *G01R 1/07307* (2013.01); *H05K 1/0212* (2013.01); *H05K 1/0306* (2013.01)

(58) Field of Classification Search
CPC ............ G01R 1/07307; G01R 31/2874; G01R 31/2886; G01R 1/07314; H05K 1/0212; H05K 1/0306; H05K 1/116; H05K 3/4629; H05K 2201/09681; H05K 3/46; H01L 22/00
See application file for complete search history.

(56) References Cited

U.S. PATENT DOCUMENTS

2010/0156449 A1    6/2010 Nitta et al.

FOREIGN PATENT DOCUMENTS

JP    2010-151497 A    7/2010

*Primary Examiner* — Robert G Bachner
(74) *Attorney, Agent, or Firm* — Volpe Koenig

(57) ABSTRACT

A circuit board has: an insulating substrate formed by plural ceramic insulating layers being layered on one another and having a first surface and a second surface on the opposite side to the first surface; a circuit conductor passing through the inside of the insulating substrate and positioned in a region from the first surface to the second surface; and at least one heating wire positioned in the insulating substrate. The heating wire is positioned in, among plural interlayer regions between the ceramic insulating layers, at least one interlayer region between the ceramic insulating layers and has a mesh shape having plural first through holes through which a portion of the circuit conductor passes and having plural second through holes through which the circuit conductor does not pass.

9 Claims, 13 Drawing Sheets

US 12,392,802 B2

CIRCUIT BOARD, PROBE CARD SUBSTRATE, AND PROBE CARD

TECHNICAL FIELD

The present invention relates to a circuit board for probe card and a probe card.

BACKGROUND

Regarding circuit boards dedicated to a probe card that is used for electrical inspection on a semiconductor device on a wafer, a circuit board having a heating element (heating wire) is known (for example, refer to Japanese Unexamined Patent Application Publication No. 2010-151497). The circuit board and a probe card can be heated by the heating wire disposed in the circuit board being caused to generate heat. Thus, a wafer can be inspected while being heated. Regarding such a circuit board, the heating wire has a through hole for preventing a circuit conductor provided for inspection from being in contact with the heating wire, and the circuit conductor passes through the through hole and thus passes through the heating wire without being in contact with the heating wire.

SUMMARY

A circuit board of an embodiment of the present disclosure has: an insulating substrate formed by plural ceramic insulating layers being layered on one another and having a first surface and a second surface on the opposite side to the first surface; plural circuit conductors passing through the inside of the insulating substrate and positioned in a region from the first surface to the second surface; and at least one heating wire positioned in, among plural interlayer regions between the ceramic insulating layers in the insulating substrate, at least one interlayer region between the ceramic insulating layers. The heating wire has a mesh shape having plural first through holes through which portions of the circuit conductors pass and having plural second through holes through which the circuit conductors do not pass.

A probe card substrate of an embodiment of the present disclosure has: a circuit board having the above-described configuration; and a second circuit board positioned on a first surface of the circuit board and having plural resin insulating layers and a second circuit conductor connected to a corresponding one of the circuit conductors.

A probe card of an embodiment of the present disclosure has: a probe card substrate having the above-described configuration; and a probe pin connected to the second circuit conductor.

DETAILED DESCRIPTION

Figure 1A:
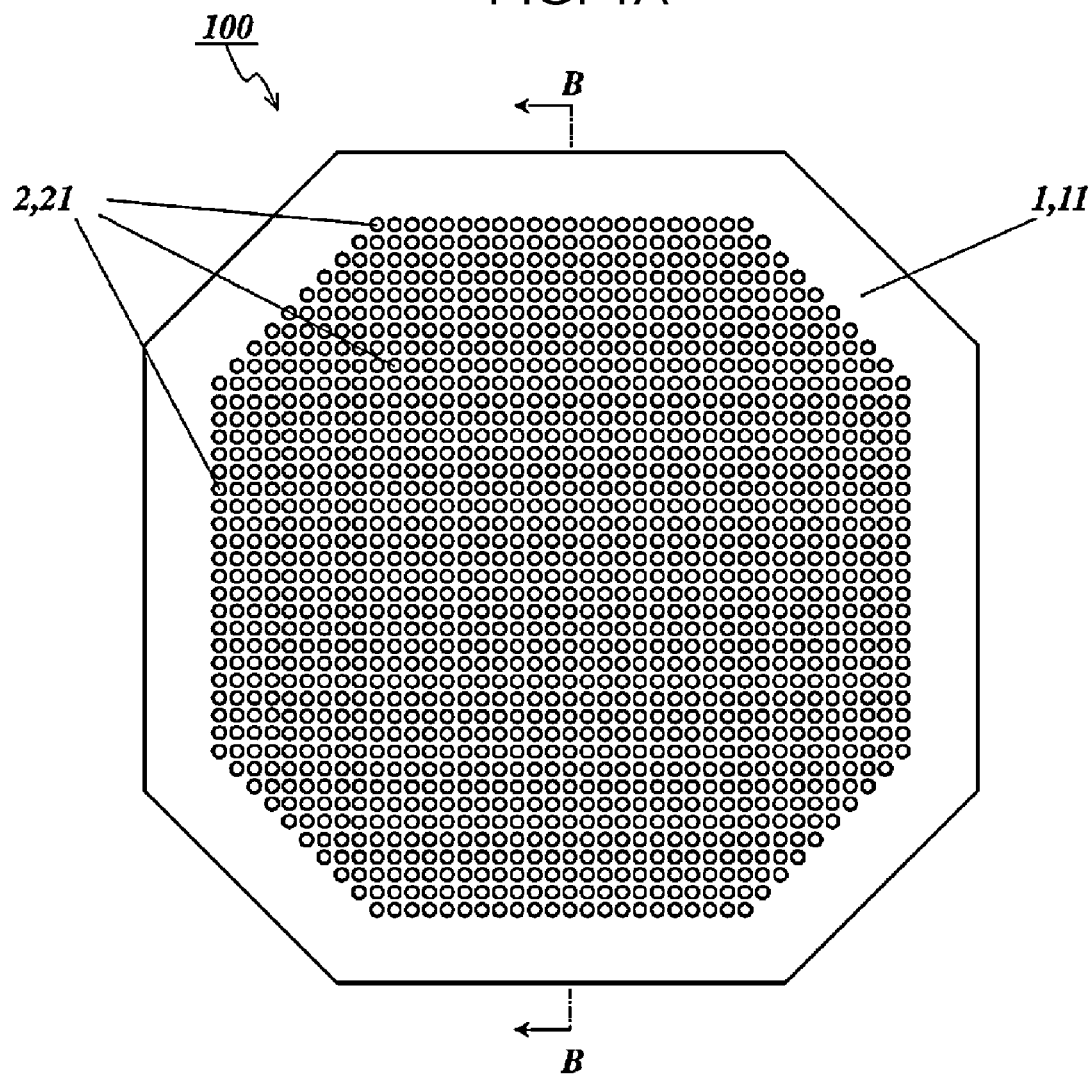
FIG. 1A is a plan view illustrating an example of a circuit board of the present disclosure.
Figure 1B:
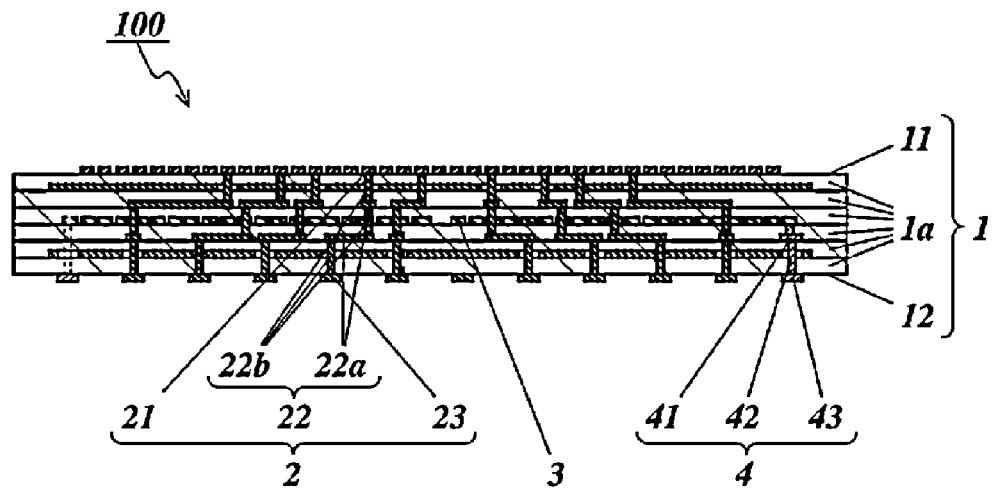
FIG. 1B is a sectional view taken along line B-B in FIG. 1A.
Figure 2:
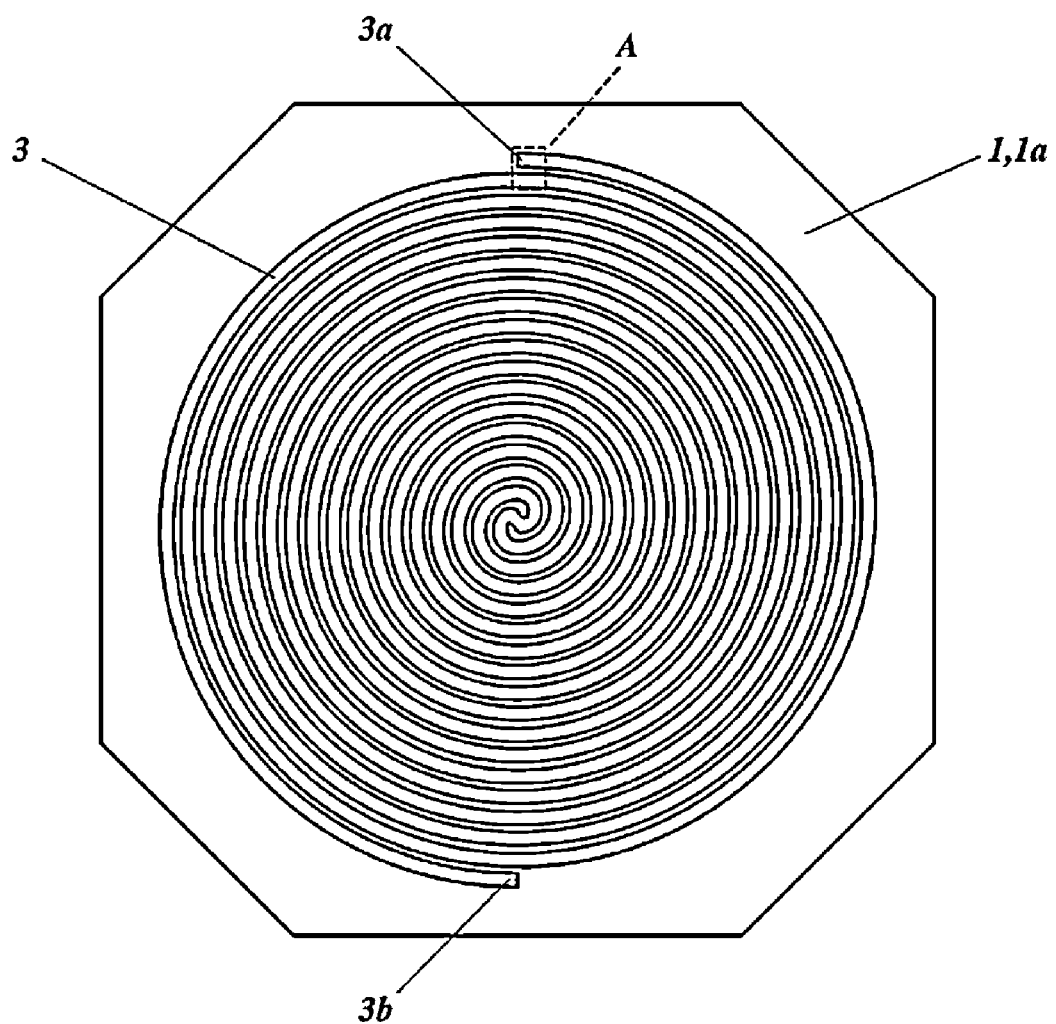
FIG. 2 is a plan view illustrating the inside of the circuit board illustrated in FIG. 1A and FIG. 1B.
Figure 3:
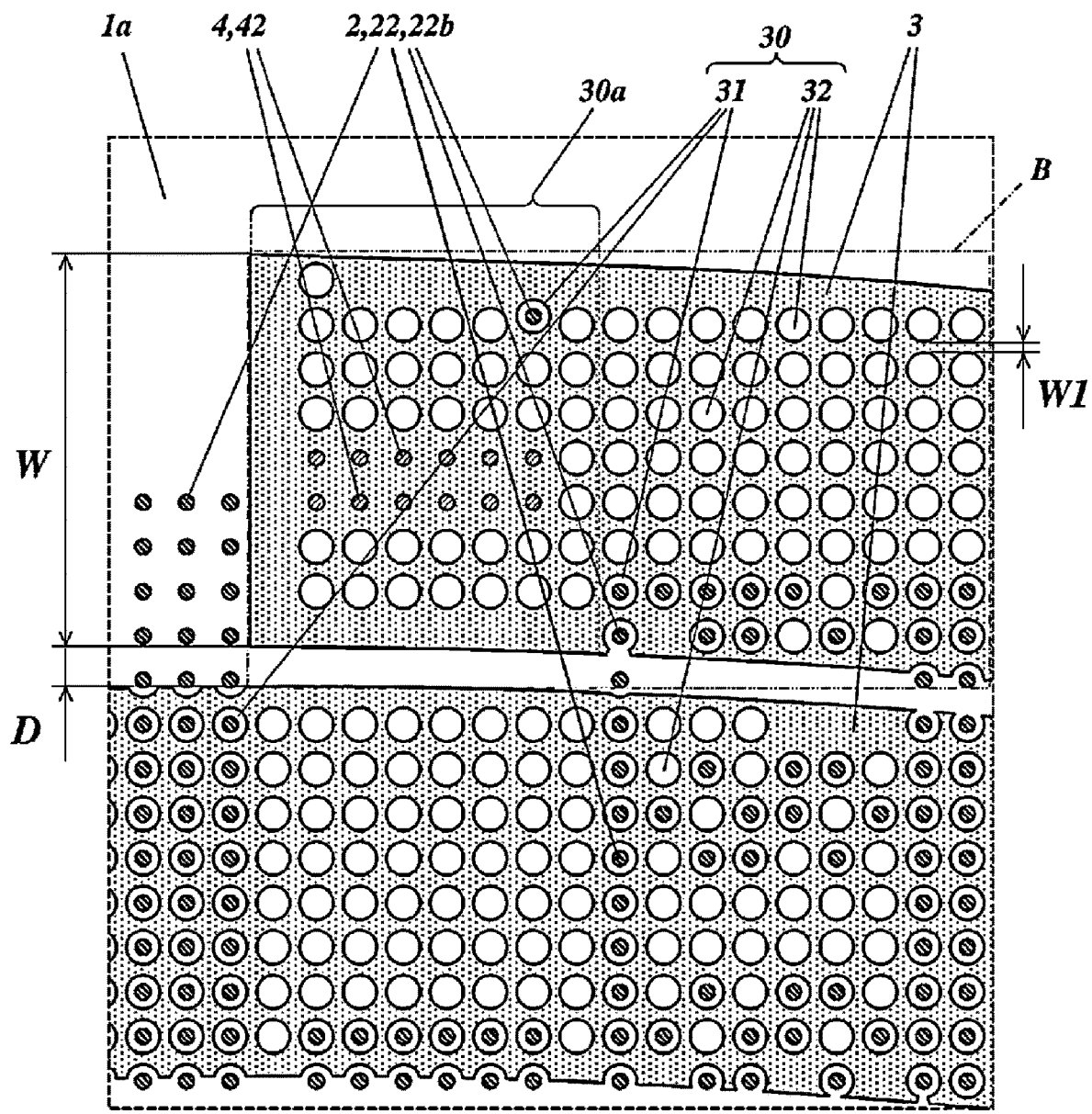
FIG. 3 is an enlarged plan view of part A in FIG. 2.
Figure 4:
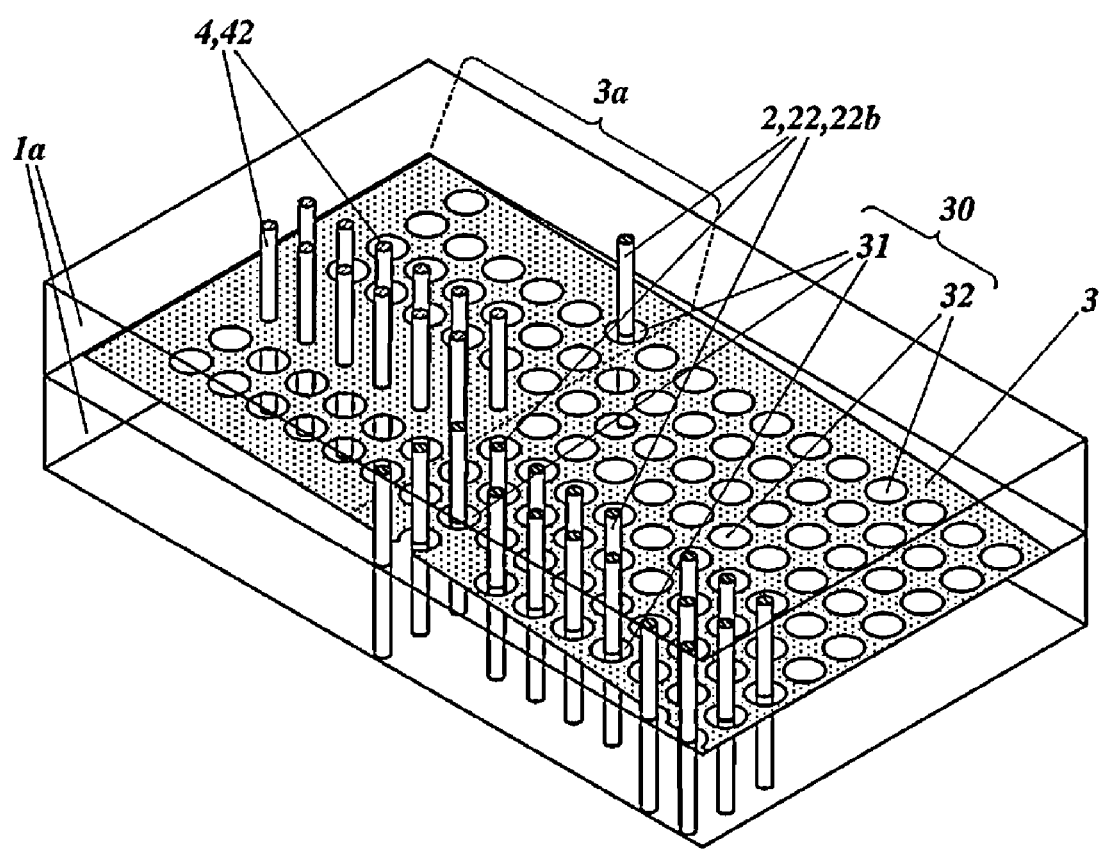
FIG. 4 is a perspective view of part B in FIG. 3.
Figure 15:
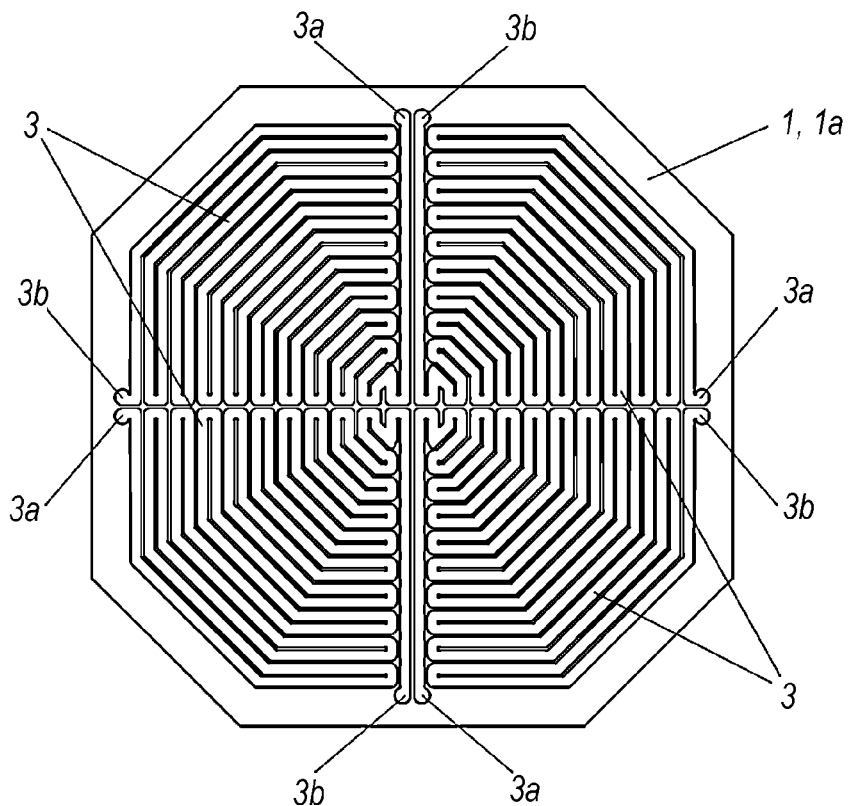
FIG. 15 is a plan view illustrating the inside of another example of the circuit board.
Figure 16:
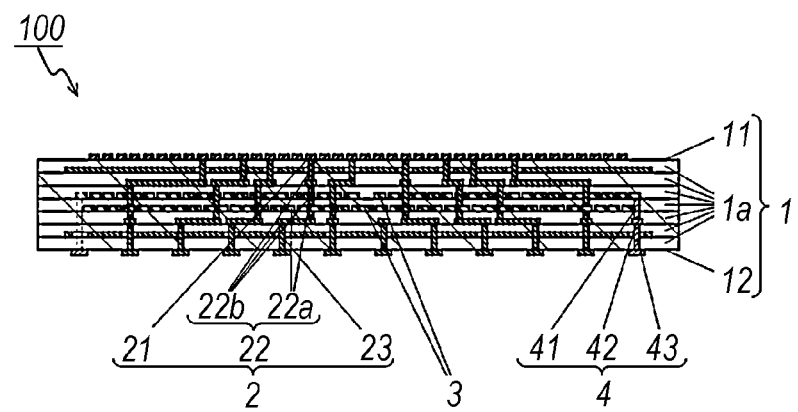
FIG. 16 is a sectional view of another example of the circuit board.
Figure 17A:
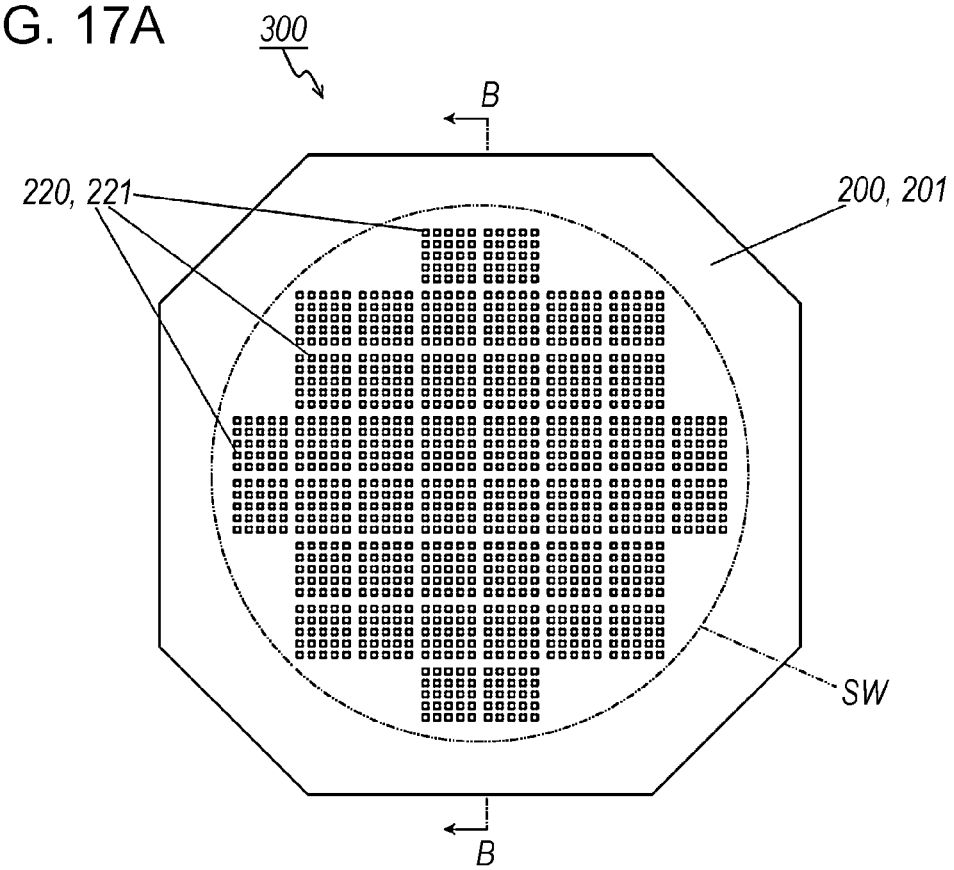
FIG. 17A is a plan view illustrating an example of a probe card substrate of the present disclosure.
Figure 17B:
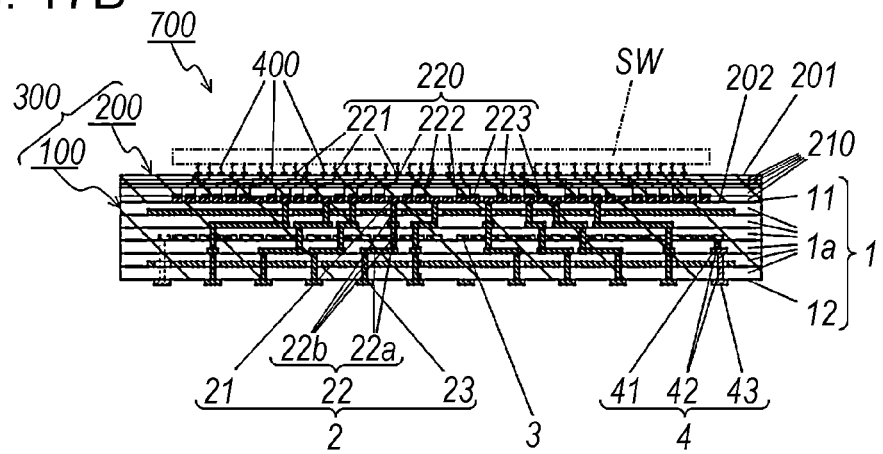
FIG. 17B is a sectional view taken along line B-B in FIG. 17A.

A circuit board, a probe card substrate, and a probe card of embodiments of the present disclosure will be described with reference to the drawings. Note that the drawings used in the following description are schematic drawings, and the upper side and the lower side are distinguished from one another for convenience's sake, not for limiting the upper side and the lower side of the circuit board or other elements when in practical use. FIG. 1A is a plan view illustrating an example of the circuit board, and FIG. 1B is a sectional view taken along line B-B in FIG. 1A. FIG. 2 is a plan view of the inside of the circuit board illustrated in FIG. 1A and FIG. 1B. FIG. 3 is an enlarged plan view of part A in FIG. 2. FIG. 4 is a perspective view of part B in FIG. 3. Each of FIGS. 5 to 8 is an enlarged plan view illustrating a main part of another example of the circuit board. Each of FIGS. 9 to 15 is a plan view illustrating the inside of another example of the circuit board. FIG. 16 is a sectional view of another example of the circuit board. FIG. 17A is a plan view illustrating an example of a probe card substrate, and FIG. 17B is a sectional view taken along line B-B in FIG. 17A. FIG. 2 and FIGS. 9 to 15 each illustrate, in a circuit board 100, an interlayer region between ceramic insulating layers 1a that includes a heating wire 3, when the interlayer region is seen through an insulating layer 1a or other elements. Other than the heating wire 3, a circuit conductor 2 or other elements positioned in the interlayer region between the ceramic insulating layers 1a are not illustrated. Note that, in FIG. 17A and FIG. 17B, a semiconductor wafer SW on which a large number of semiconductor devices to be inspected are gathered is illustrated in the dash-dot-dot line. The semiconductor wafer SW is also sometimes simply referred to as the wafer SW.

In a circuit board of the related art, a through hole is formed only in a portion in which a circuit conductor for inspection and a heating wire cross one another. Circuit conductors are rarely distributed uniformly in the plane direction, and through holes are thereby distributed ununiformly in the heating wire. In the heating wire, the amount of heat generation in a portion having a large number of through holes differs from the amount of heat generation in a portion having a small number of through holes, and temperature variation of the circuit board in the plane direction is thus very probably caused.

The circuit board 100 of an aspect of the present disclosure has an insulating substrate 1, plural circuit conductors 2, and at least one heating wire 3. The insulating substrate 1 is formed by plural ceramic insulating layers 1a being layered on one another and has a first surface 11 and a second surface 12 on the opposite side to the first surface. The circuit conductors 2 pass through the inside of the insulating substrate 1 and are positioned in a region from the first surface 11 to the second surface 12. The heating wire 3 is positioned in, among plural interlayer regions between the ceramic insulating layers in the insulating substrate 1, at least one interlayer region between the ceramic insulating layers 1a. In addition, the heating wire 3 has a mesh shape having plural first through holes 31 through which portions of the circuit conductors 2 pass and having plural second through holes 32 through which the circuit conductors 2 do not pass.

According to the circuit board 100 described above, through holes 30 including the first through holes 31 and the second through holes 32 are distributed uniformly in the heating wire 3 because the heating wire 3 has a mesh shape having the first through holes 31 through which the circuit conductors 2 pass and having the second through holes 32 through which the circuit conductors 2 do not pass. Thus, unevenness in heat generation from portion to portion of the heating wire 3 is reduced, and the circuit board 100 enables excellent uniform heating in the plane direction.

As in the example illustrated in FIG. 1A and FIG. 1B, the circuit board 100 has the insulating substrate 1, the circuit conductors 2, and the heating wire 3. The circuit board 100 is used for a probe card 700, and the probe card 700 is formed by a probe pin 400 being joined to the circuit board 100 or by the probe pin 400 being joined to a probe card substrate 300 that is formed by a second circuit board 200 is joined to the circuit board 100. In other words, the circuit board 100 is used for preparing the probe card 700 including the heating wire 3.

The insulating substrate 1 is for ensuring insulation between conductors, that is, for example, the insulation between the plural circuit conductors 2, the insulation between the circuit conductors 2 and the heating wire 3, and the insulation between a conductor on the inner side and a conductor on the outer side of the heating wire 3. The insulating substrate 1 is a layered body formed by the plural ceramic insulating layers 1a (hereinafter, also sometimes simply referred to as the insulating layer 1a) being layered on one another.

The circuit conductors 2 include, for example, a joint conductor 21 on the first surface 11 of the insulating substrate 1, an internal conductor 22 in the insulating substrate 1, and an external terminal 23 on the second surface 12. In the probe card substrate 300, which will be described later, the joint conductor 21 is connected to a second circuit conductor 220 of the second circuit board 200 provided on the first surface 11. When the probe card 700 is formed without the second circuit board 200, the probe pin 400 is joined to the joint conductor 21 to be electrically connected to the joint conductor 21. The external terminal 23 is for connecting the probe card 700 including the circuit board 100 to an inspection device. The internal conductor 22 is for electrically connecting the external terminal 23 and the joint conductor 21 to one another. The internal conductor 22 has an internal conductor layer 22a positioned in an interlayer region between the insulating layers 1a and a through conductor 22b passing through an insulating layer 1a in the thickness direction. The through conductor 22b connects the internal conductor layers 22a positioned in different interlayer regions between the insulating layers 1a or connects the internal conductor layer 22a to the joint conductor 21 or to the external terminal 23. When the second circuit board 200 is provided, the joint conductor 21 is not provided on the first surface 11, and a portion (end surface), of the through conductor 22b of the internal conductor 22, exposed at the first surface 11 can also serve as the joint conductor 21. The first surface 11 and the second surface 12 of the insulating substrate 1 are also the first surface 11 and the second surface 12 of the circuit board 100.

The circuit board 100 further includes the heating wire 3 in an interlayer region between the ceramic insulating layers 1a inside the insulating substrate 1. The heating wire 3 is a heating element that generates heat by being fed with electric power via a feeding conductor 4. Surfaces including the upper surface of the circuit board 100 (the first surface 11 of the insulating substrate 1) are heated by the heat generated by the heating wire 3, and the wafer SW to be inspected can be heated through, for example, the second circuit board 200. The feeding conductors 4 include a feeding conductor layer 41 in an interlayer region between the insulating layers 1a, a feeding through conductor 42 passing through an insulating layer 1a, and a feeding terminal 43 of the second surface 12 of the insulating substrate 1. Regarding the feeding through conductor 42, one end passes through an insulating layer 1a to be connected to the heating wire 3, and the other end is connected to the feeding terminal 43 via the feeding conductor layer 41 or in a direct manner.

As in the examples illustrated in FIGS. 3 to 8, the heating wire 3 has a large number of through holes 30 and thus has a mesh shape as a whole. The through holes 30 include the first through holes 31 through which the circuit conductors 2 pass and the second through holes 32 through which the circuit conductors 2 do not pass. Each of the first through holes 31 is provided for preventing the circuit conductor 2 and the heating wire 3 from being in contact with one another and has a size large enough to ensure the insulation between the circuit conductor 2 and the heating wire 3. The circuit conductor 2 passing through the first through hole 31 is the through conductor 22b of the internal conductor 22. The first through holes 31 are at positions corresponding to the arrangement of the circuit conductors 2 (that is, the through conductors 22b). For example, in the examples illustrated in FIG. 3, FIG. 4, FIG. 6, and FIG. 7, the through conductors 22b of the circuit conductors 2 are vertically and horizontally arranged, that is, the through conductors 22b are positioned at lattice points of the lattice, and, in the examples illustrated in FIG. 5 and FIG. 8, the through conductors 22b are arranged in staggered manner, that is, the through conductors 22b are positioned at lattice points of the slanted lattice. However, the through conductors 22b of the circuit conductors 2 are not positioned at all the lattice points uniformly. On the other hand, the through holes 30 include not only the first through holes 31 through which the through conductors 22b pass but also the second through holes 32 through which the through conductors 22b do not pass, thereby being at the positions corresponding to all the lattice points. That is, the second through holes 32 are positioned in the regions of the heating wire 3 in which the first through holes 31 are not positioned. Thus, the through holes 30 are distributed nearly uniformly in the heating wire 3. Note that, when the through conductor 22b of the circuit conductor 2 overlaps the outer edge of the heating wire 3, the first through hole 31 also overlaps the outer edge of the heating wire 3; thus, the first through hole 31 in this case is not a through hole whose entire perimeter is surrounded by the heating wire 3 but has a notched shape as in the examples illustrated in, for example, FIGS. 3 to 8.

Regarding the example illustrated in FIG. 3, part (part A) enclosed with the broken line in FIG. 2 and including one end portion 3a of the heating wire 3 is enlarged and illustrated. Regarding the example illustrated in FIG. 4, only part (part B) of an upper portion of the heating wire 3 enclosed with the dash-dot-dot line in FIG. 3 is illustrated. The heating wire 3 in FIG. 3 and FIG. 4 has a region in which a large number of first through holes 31 are arranged, that is, nine first through holes 31 are arranged in the width direction of the heating wire 3, and the heating wire 3 in FIG. 3 and FIG. 4 has a region in which a small number of first through holes 31 are arranged, that is, no first through holes 31 are formed, or one to four first through holes 31 are arranged in the width direction of the heating wire 3. Such a region having a small number of first through holes 31 has three to eight second through holes 32. Thus, over almost the entire region of the heating wire 3 in the length direction, five to nine through holes 30 in total are arranged in the width direction. The region having only five or six through holes 30 is a region to which the feeding conductors 4 (the feeding through conductors 42) are connected, and the other region has seven to nine through holes 30 including both the first through holes 31 and the second through holes 32. The feeding conductors 4 are connected to both the end portions 3a and 3b of the heating wire 3, and a portion of the heating wire 3 between the end portions 3a and 3b to which the feeding conductors 4 are connected, mainly generates heat. Thus, the portion that generates heat has a similar number of through holes 30 in the width direction, and variation in the amount of heat generation is thereby reduced in the length direction. Consequently, because the second through holes 32 are for reducing variation in the amount of heat generation, the through holes 30 including both the first through holes 31 and the second through holes 32 are not necessarily distributed perfectly uniformly in the heating wire 3.

Figure 5:
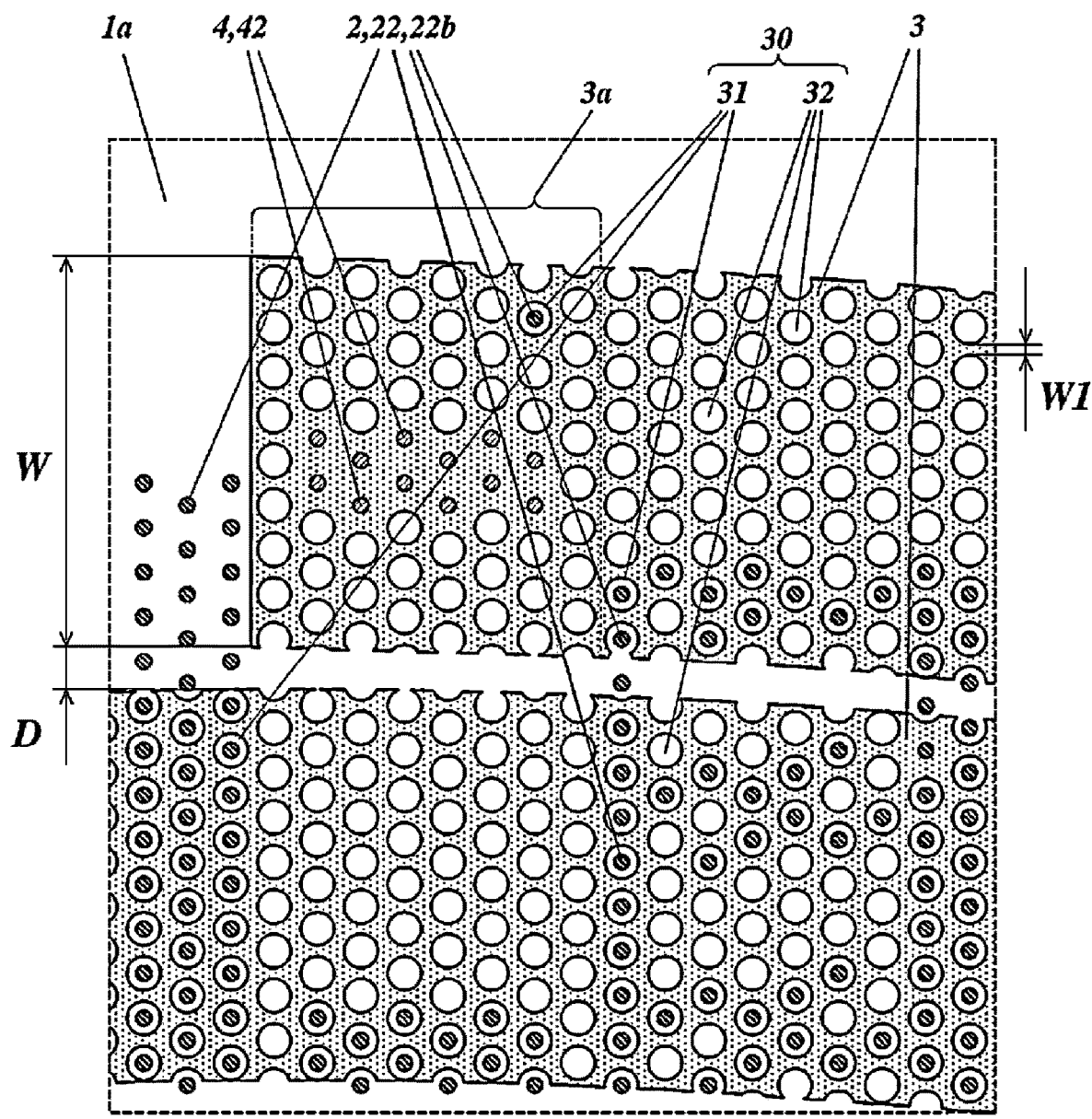
FIG. 5 is an enlarged plan view illustrating a main part of another example of the circuit board.
Figure 6:
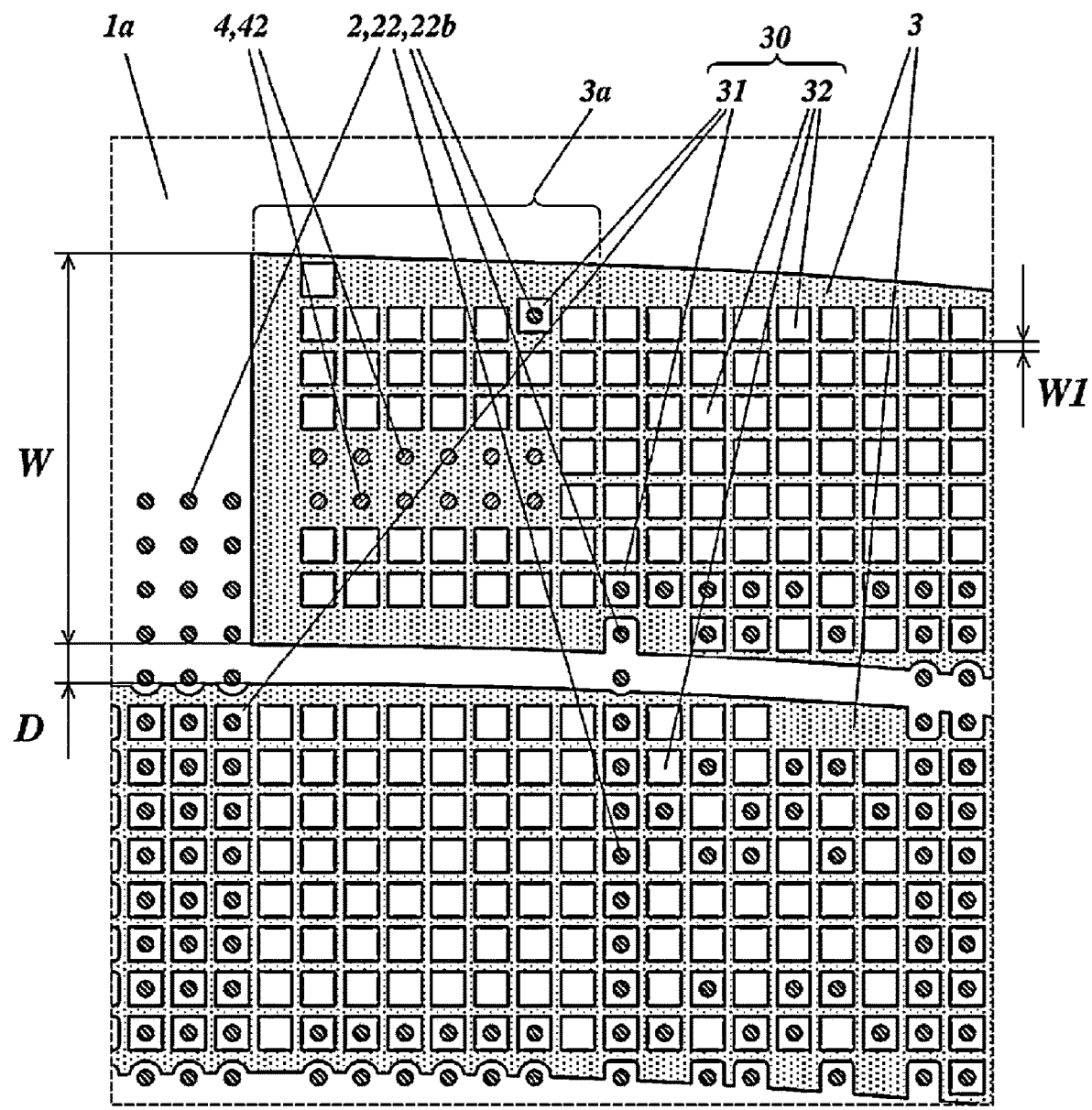
FIG. 6 is an enlarged plan view illustrating a main part of another example of the circuit board.
Figure 7:
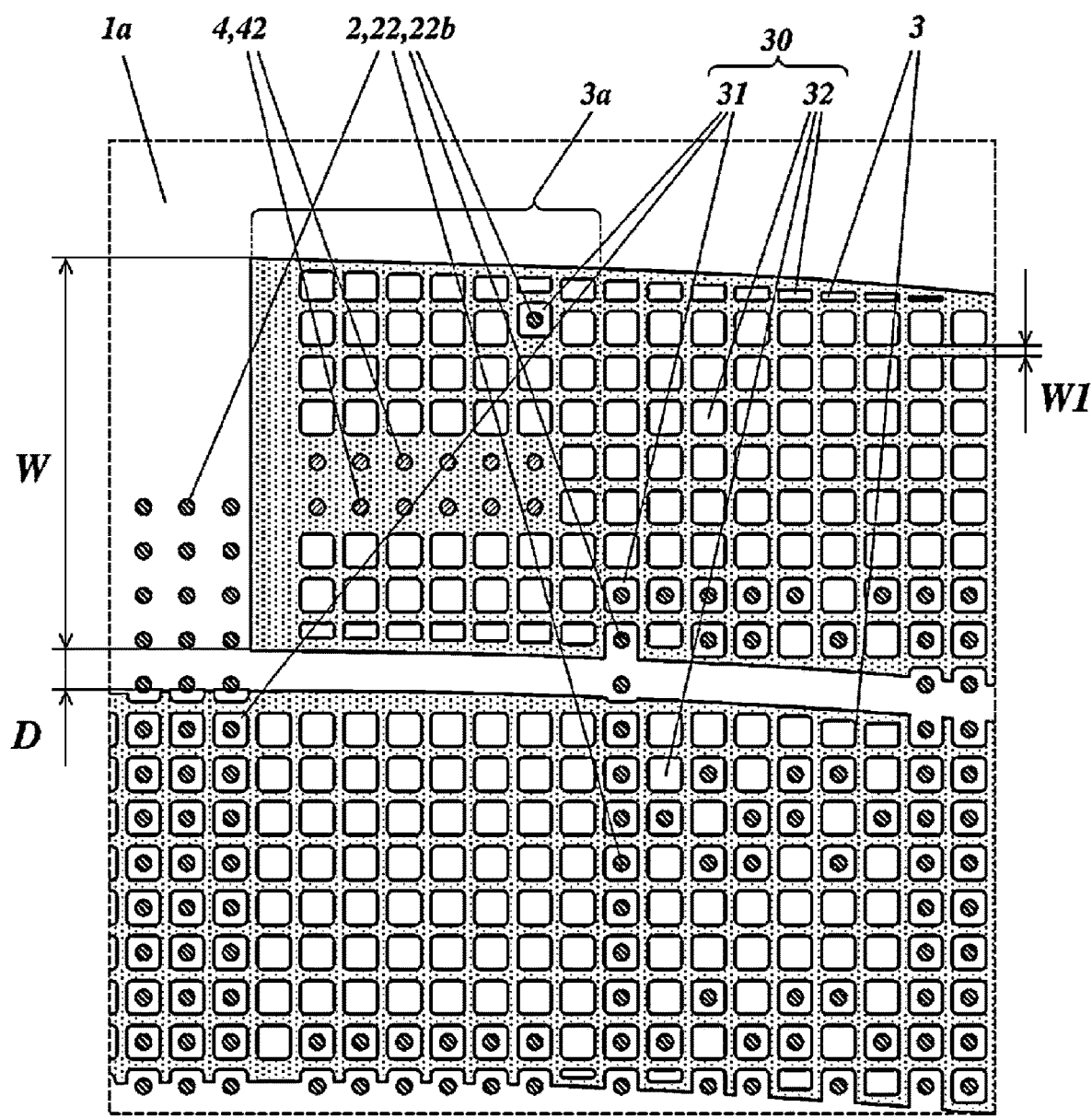
FIG. 7 is an enlarged plan view illustrating a main part of another example of the circuit board.
Figure 8:
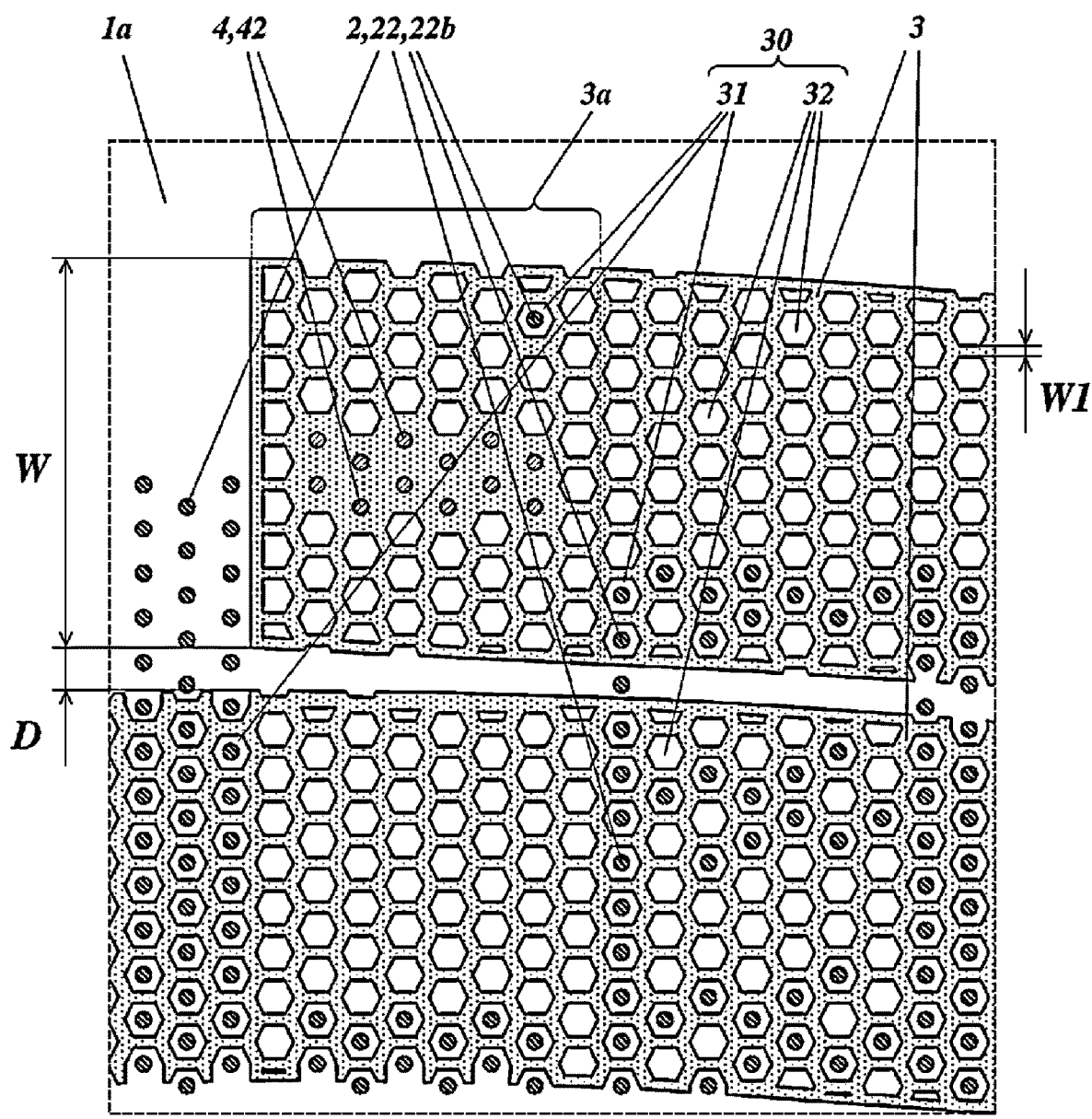
FIG. 8 is an enlarged plan view illustrating a main part of another example of the circuit board.

The shape of the through hole 30 is not particularly limited and can be a circular shape as in the examples illustrated in FIGS. 3 to 5, a quadrilateral shape as in the examples illustrated in FIG. 6 and FIG. 7, or a polygonal shape such as a hexagonal shape as in the example illustrated in FIG. 8. The through conductor 22b of the circuit conductor 2 passing through inside the first through hole 31 typically has a columnar shape, and the first through hole 31 can thus have a circular shape as in the examples illustrated in FIGS. 3 to 5. In the case in which the first through hole 31 has a circular shape, the first through hole 31 has the minimum opening area while a required clearance is ensured over the columnar-shaped through conductor 22b and the entire periphery thereof. Thus, a width W1 of a conductive path of the heating wire 3 is prevented from being excessively reduced, the degree of flexibility in design regarding a wire width W is increased, and electric power resistance is also increased. The first through hole 31 illustrated in FIG. 6 has a quadrilateral shape (square shape), whereas the first through hole 31 illustrated in FIG. 7 has a rounded-corner, quadrilateral shape (square shape). In this case, the opening area of the first through hole 31 can be reduced compared with the case in which the corners are not rounded.

The shape and size of the second through hole 32 in each of the examples illustrated in FIGS. 3 to 8 are, in most cases, the same as the shape and size of the first through hole 31. The first through hole 31 and the second through hole 32 may also have different sizes and shapes. When the first through holes 31 and the second through holes 32 have the same size and shape, due to the arrangement of the through holes, the through holes 30 are easily distributed uniformly, and the heat uniformity of the heating wire 3 is easily improved.

Not all the second through holes 32 may have the same size and shape. For example, in the examples illustrated in FIG. 7 and FIG. 8, the second through holes 32 include the through holes having the same size and shape as those of the first through hole 31 and include the through holes having sizes and shapes differing from those of the first through hole 31. For example, in comparison between the example illustrated in FIG. 6 and the example illustrated in FIG. 7, the example illustrated in FIG. 7 has a configuration similar to the configuration of the example illustrated in FIG. 6 but further has second through holes 32 having sizes and shapes differing from those of the first through hole 31. Specifically, the second through holes 32 smaller than the first through hole 31 are formed in an outer edge portion of the heating wire 3. Thus, the through holes 30 are distributed more uniformly. Consequently, when all the second through holes 32 do not have the same size and shape, the distribution of the through holes 30 is easily adjusted, and the circuit board 100 thereby has the heating wire 3 with further improved heat uniformity.

As in the examples illustrated in FIG. 2 and FIGS. 9 to 15, it is possible to form the circuit board 100 in which the heating wire 3 is formed spirally or concentrically in plan perspective, and the wire width W of the heating wire 3 is larger than a distance D between turns of the heating wire 3. Note that, in the examples illustrated in FIGS. 9 to 15, both the end portions 3a and 3b of the heating wire 3 have a rounded shape for easy identification of the positions of both the end portions 3a and 3b of the heating wire 3. The end portions 3a and 3b are not necessarily rounded as with the heating wire 3 illustrated in FIG. 2.

Because having a mesh shape, the heating wire 3 has a small width W1 of the conductive path between corresponding ones of the through holes 30 (the first through holes 31 and the second through holes 32). Regarding this, when the circuit board 100 has the above-described configuration, the number of conductive paths in the wire width is increased by the entire wire width W of the heating wire 3 being increased; thus, even if the heating wire 3 has a mesh shape, heat generation is prevented from being excessively large, electric power resistance is increased, and the circuit board 100 can have high reliability. In addition, when the wire width of the heating wire 3 is large, a large number of through holes 30 can be arranged in the wire width direction. Thus, even when the through holes 30 are not arranged perfectly uniformly, variation in the number of conductive paths in the wire width is reduced, and heat uniformity is further improved. In addition, the wafer SW to be heated has a circular shape in many cases, and the entire heating wire 3 accordingly has a circular outer shape when being formed spirally or concentrically; thus, heat uniformity is improved.

Moreover, as in the example illustrated in, for example, FIG. 3, when the distance D between turns of the heating wire 3 is reduced to a distance still sufficient to ensure insulation and if the wire width is made as large as possible, the ratio of the area of the heating wire 3 to a heating region is increased, and heat uniformity is thereby improved. Specifically, the ratio of the heating wire 3 to the area of a figure formed by outermost peripheries of the entire heating wire 3 being connected to one another, such as a circular shape, can be 80% or more. In other words, the wire width W of the heating wire 3 can be ten times or more as large as the distance D between turns of the heating wire 3.

Figure 9:
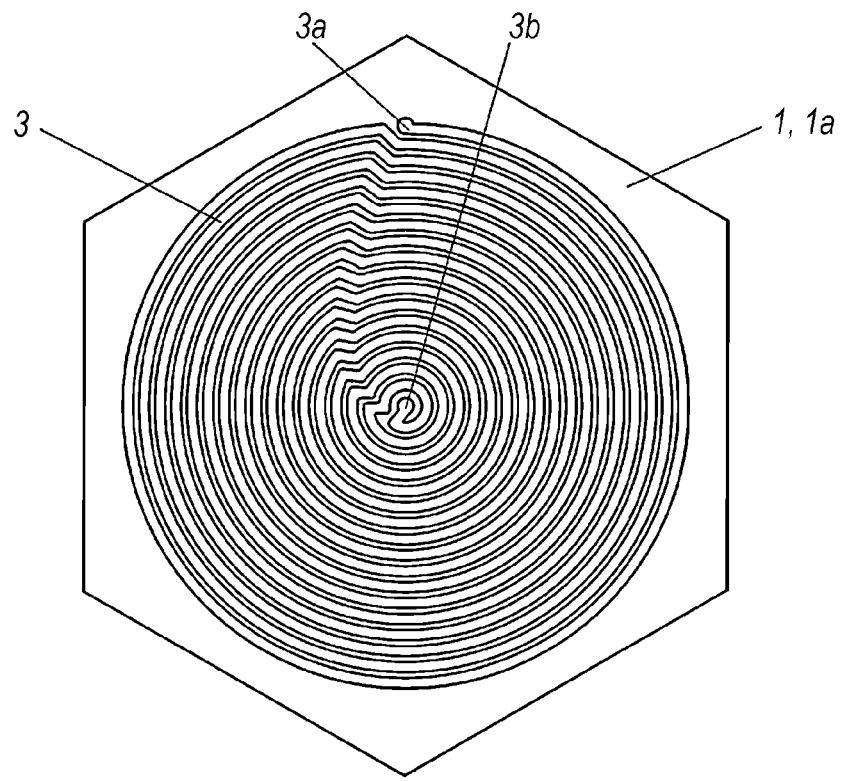
FIG. 9 is a plan view illustrating the inside of another example of the circuit board.
Figure 12:
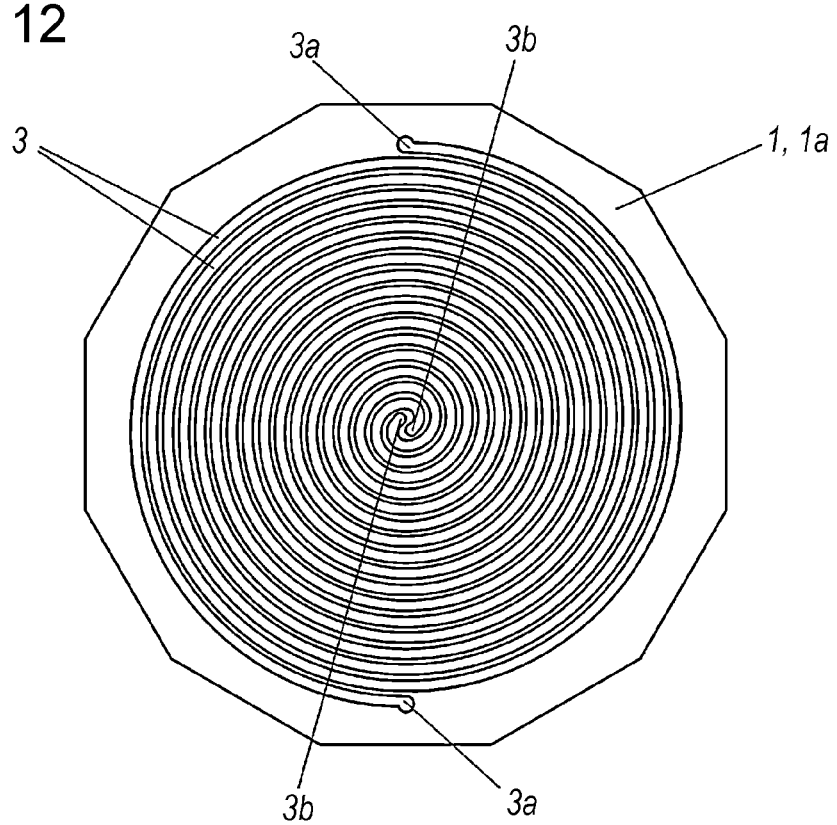
FIG. 12 is a plan view illustrating the inside of another example of the circuit board.

A spiral shape here is not limited to only a typical spiral shape, and examples of the spiral shape include the shapes in the examples illustrated in, for example, FIG. 2, FIG. 9, and FIG. 12. Regarding the heating wire 3 of the example illustrated in FIG. 9, there are concentrically arranged 17 circular pieces of the heating wire whose diameters differing from one another and that are partially cut off, and such heating-wire pieces arranged radially next to one another are connected to one another to form one spiral heating wire 3. Due to such a spiral shape, two end portions 3a and 3b of the heating wire 3 are respectively positioned at an outer edge portion and at a central portion, in plan perspective, of the insulating substrate 1. The heating wire combination 3 of the example illustrated in FIG. 12 includes two spiral heating wires 3 that are each wound ten times. The two heating wires 3 have the same shape, and, relative to one heating wire 3, the other heating wire 3 is rotated by 180 degrees. The two heating wires 3 are arranged so that, between turns of the one heating wire 3, turns of the other heating wire 3 are positioned. In this example, two end portions 3a and 3b of one heating wire 3 are also respectively positioned at a central portion and at an outer edge portion, in plan perspective, of the insulating substrate 1. The end portions 3a of the respective two heating wires 3 are positioned opposite to one another with the central portion, in plan perspective, of the insulating substrate 1 interposed therebetween. The heating wire 3 of the example illustrated in FIG. 2 has a shape in which the two heating wires of the example illustrated in FIG. 12 are connected to one another at a center portion of each spiral. Thus, the two end portions 3a and 3b of the heating wire 3 are both positioned at the outer edge portion, in plan perspective, of the insulating substrate 1 and positioned opposite to one another with the center portion interposed therebetween.

Figure 10:
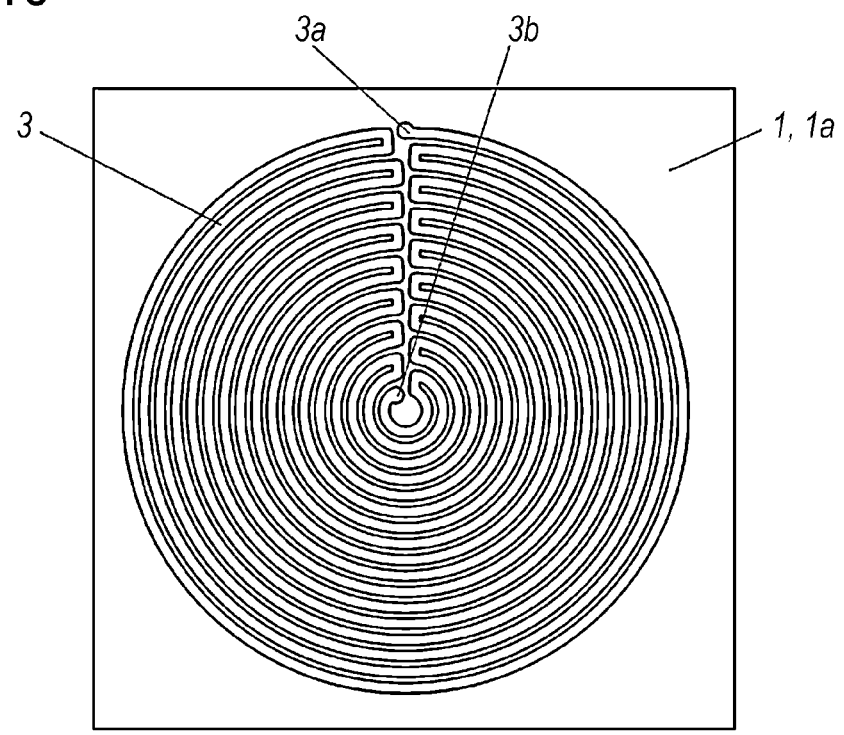
FIG. 10 is a plan view illustrating the inside of another example of the circuit board.
Figure 11:
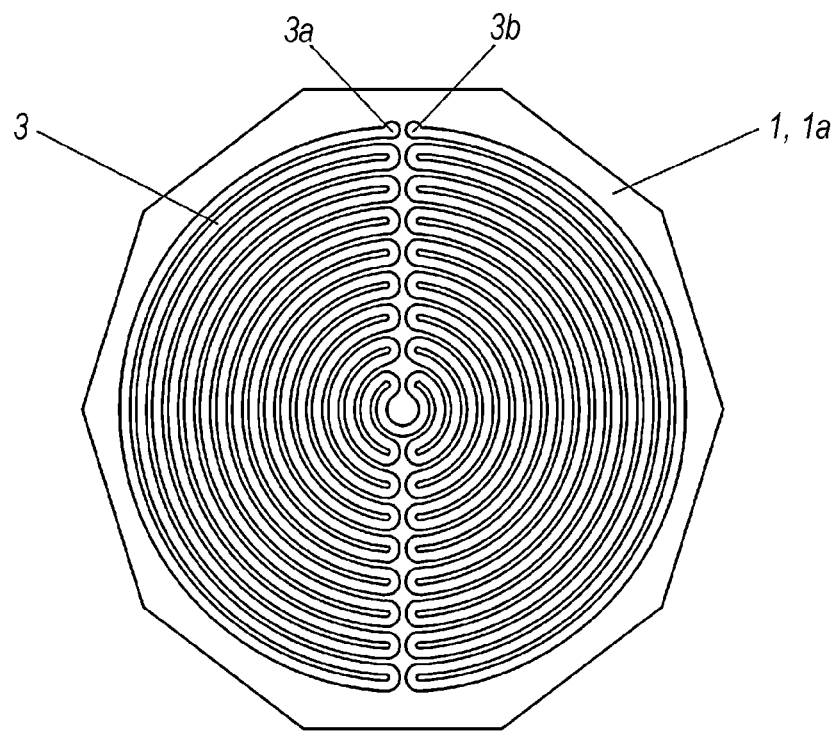
FIG. 11 is a plan view illustrating the inside of another example of the circuit board.

In addition, examples of a concentric shape include the shapes of the examples illustrated in, for example, FIG. 10, FIG. 11, FIG. 13, and FIG. 14. Regarding the heating wire 3 of the example illustrated in FIG. 10, there are concentrically arranged 17 circular pieces of the heating wire whose diameters differing from one another, such heating-wire pieces arranged radially next to one another are connected to one another, and the heating wire 3 has a shape in which the diameter decreases while the heating wire 3 turns back at one connected portion after another. Two end portions 3a and 3b of the heating wire 3 are respectively positioned at a central portion and at an outer edge portion, in plan perspective, of the insulating substrate 1. The heating wire 3 of the example illustrated in FIG. 11 is constituted by two heating wires each having a semicircular shape as a whole. In each semicircular heating wire, there are concentrically arranged 17 semicircular pieces of the heating wire whose diameters differing from one another, such heating-wire pieces arranged radially next to one another are connected to one another, and the diameter decreases while the heating wire 3 turns back at one connected portion after another. The two semicircular heating wires are symmetric about the chords of the semicircles. Regarding the heating wire 3, the two semicircular heating wires are laterally arranged with the chords of the semicircles facing one another, the end portions positioned at a center portion are connected to one another, and the heating wire 3 thus has a circular shape as a whole. Thus, two end portions 3a and 3b of the heating wire 3 are both positioned side by side at an outer edge portion, in plan perspective, of the insulating substrate 1. When the semicircular heating wires are point symmetric about the center of the arranged semicircles, the two end portions 3a and 3b of the heating wire 3 are positioned opposite to one another with the center portion interposed therebetween. The heating wire combination 3 of the example illustrated in FIG. 13 has two heating wires: a heating wire 3 having a large-diameter ring shape as a whole and a heating wire 3 disposed on the inner side relative to the large-diameter ring-shape heating wire 3 and having a circular shape as a whole. The heating wire combination 3 has a shape in which the heating wire 3 of FIG. 10 is divided into an inner portion and an outer portion, and the inner portion is vertically inverted. Thus, regarding the heating wire combination 3, two end portions 3a and 3b of each of the heating wires 3 are positioned so as to be radially separated from one another. The heating wire combination 3 of the example illustrated in FIG. 14 has a shape in which the heating wire 3 of FIG. 11 is cut at the center in the length direction to be divided into two portions, and a right portion and a left portion are each rotated leftward by 90 degrees to be laterally inverted. In other words, the heating wire combination 3 has a shape in which two semicircular heating wires 3 are vertically arranged with the chords of the semicircles facing one another. Two end portions 3a and 3b of one heating wire 3 are respectively positioned at a central portion and an outer edge portion, in plan perspective, of the insulating substrate 1 and arranged laterally. The heating wire combination 3 of the example illustrated in FIG. 15 has four heating wires 3, and the shape of the entire heating wire combination 3 is not circular but octagonal. Octagonal heating-wire pieces having sizes differing from one another are arranged so that the centers thereof are aligned, the arranged heating-wire pieces are divided into four portions, adjacent heating-wire pieces on the inner side and on the outer side are connected to one another, and the four heating wires 3 are formed. Examples of a concentric shape also include the shape in which plural heating-wire pieces 3 having similar shapes and having sizes differing from one another are arranged with the centers thereof being aligned, and adjacent heating-wire pieces on the inner side and on the outer side are connected to one another as described above. In addition, a spiral shape is not necessarily circular and may also be polygonal. Note that the outer shape of the entire heating wire combination 3 of the example illustrated in FIG. 15 is an octagonal shape that is shaped along the outer shape of the octagonal insulating substrate 1, and, by the entire heating wire 3 having a shape similar to the outer shape of the insulating substrate 1 as describe above, the entire insulating substrate 1 (circuit board 100) can be heated.

As in the above-described examples illustrated in FIGS. 12 to 15, it is possible to form the circuit board 100 including plural heating wires 3 in one interlayer region between the ceramic insulating layers 1a.

With such a configuration, even if the density of the heating wire 3 is increased, a desired amount of heat generation can be obtained by the heating wire 3 having an appropriate length, and a desired heating temperature is thereby easily set. In addition, when temperature distribution is likely to appear in the circuit board 100 due to, for example, outside air, the amount of heat generation can be adjusted depending on positions in the circuit board 100 by electric powers to be supplied to the plural heating wires 3 being different from one another, and the circuit board 100 thereby has further excellent heat uniformity.

The number and arrangement of plural heating wires 3 in one interlayer region between the insulating layers 1a are not particularly limited. As described above, each of the circuit boards 100 of the examples illustrated in FIGS. 12 to 14 has the two heating wires 3 in one interlayer region between the insulating layers 1a, and the circuit board 100 of the example illustrated in FIG. 15 has the four heating wires 3 in one interlayer region between the insulating layers 1a. In addition, regarding the circuit board 100 of the example illustrated in FIG. 12, the two heating wires 3 are arranged at the same position with turns of one heating wire and turns of the other heating wire being positioned alternately. Regarding the circuit board 100 of the example illustrated in FIG. 13, the two heating wires 3 are arranged on the inner side and on the outer side in the plane direction of the insulating layer 1a. Regarding the circuit board 100 of the example illustrated in FIG. 14, the two heating wires 3 are arranged side by side in the plane direction of the insulating layer 1a. Regarding the circuit board 100 of the example illustrated in FIG. 15, the four heating wires 3 are arranged in the respective four regions into which the plane of the insulating layer 1a is divided equally. Note that a distance between plural heating wires 3 can be nearly the same as the distance D between lines of one heating wire 3. Thus, even when plural heating wires 3 are provided, the density distribution of the heating wires 3 is uniform, and good heat uniformity is achieved.

In addition, as in the example illustrated in FIG. 16, the heating wires 3 can be arranged in plural interlayer regions between the insulating layers 1a. In other words, plural heating wires 3 can be arranged not only in the plane direction of the insulating substrate 1 but also in the thickness direction of the insulating substrate 1. Heating is enabled in a short time by plural heating wires 3 positioned in plural interlayer regions between the insulating layers 1a. It is possible to make up for a deficiency of the amount of heat generation when the disposition of the heating wire 3 in only one interlayer region between the insulating layers 1a leads to an insufficient amount of heat generation. In addition, because there is no need to increase the temperature of one heating wire 3, electric power resistance can be increased, and the circuit board 100 can have high reliability. The number and arrangement of the heating wires 3 in each of the plural interlayer regions between the insulating layers 1a are not particularly limited to such above-described configurations. In addition, although the circuit board 100 of the example illustrated in FIG. 16 has the heating wires 3 provided in the respective two interlayer regions between the insulating layers 1a, the number of interlayer regions between the insulating layers 1a in which the heating wires 3 are provided (the number of heating wires 3 arranged in the thickness direction of the insulating substrate 1) is also not limited to two. For example, three or more interlayer regions between the insulating layers 1a may include the respective heating wires 3. Thus, the number and arrangement of heating wires 3 can be set according to the heat generation property that the circuit board 100 is required to have.

Such an above-described circuit board 100 is used for, for example, the probe card 700 provided for inspecting plural semiconductor devices on the wafer SW. Although the probe card substrate can be formed by the probe pin 400, which is to be in contact with an electrode of the semiconductor device, being connected to the joint conductor 21 of the circuit board 100, for a minute electrode of the semiconductor device, a more minute circuit can be provided on the above-described circuit board 100.

That is, as in the example illustrated in FIG. 17A and FIG. 17B, the probe card substrate 300 of an embodiment of the present disclosure has the circuit board 100 having the above-described configuration and the second circuit conductors 220 positioned on the first surface 11 of the circuit board 100 and connected to the plural resin insulating layers 210 and the circuit conductors 2.

The probe card substrate 300 having such an above-described configuration has the circuit board 100 having the above-described configuration, thereby having high heat uniformity in the plane direction. In addition, by the second circuit conductor 220 of the second circuit board 200 being made more minute than the circuit conductor 2 of the circuit board 100, a large number of semiconductor devices having minute electrodes and disposed on the semiconductor wafer SW with high density can be inspected.

The probe card 700 of an embodiment of the present disclosure has, as in the example illustrated in FIG. 17B, the probe card substrate 300 having the above-described configuration and the probe pin 400 connected to the second circuit conductor 220.

Such an above-described probe card 700 has the circuit board 100 and the probe card substrate 300 that have the above-described configurations, and plural semiconductor devices on the wafer SW can thereby be inspected while being heated uniformly.

Regarding the probe card substrate 300 of the example illustrated in FIG. 17A and FIG. 17B, the second circuit board 200 is positioned on the first surface 11 of the circuit board 100. The second circuit board 200 has a resin insulating substrate having five resin insulating layers 210 layered on one another and the second circuit conductors 220 positioned in a region from the upper surface of the resin insulating substrate (a third surface 201) to the lower surface of the resin insulating substrate (a fourth surface 202). The second circuit conductors 220 include a second joint conductor 221 on the third surface 201 of the resin insulating substrate, a second internal conductor 222 in the resin insulating substrate, and a third joint conductor 223 on the fourth surface 202 of the resin insulating substrate. In the probe card substrate 300, the second joint conductor 221 is for being joined to the probe pin 400 to be electrically connected to the probe pin 400. The third joint conductor 223 is for making electrical connection to the joint conductor 21 on the first surface of the circuit board 100. The second internal conductor 222 electrically connects the second joint conductor 221 and the third joint conductor 223 to one another. The second internal conductor 222 has a second internal conductor layer (no reference sign given) positioned in an interlayer region between the resin insulating layers 210 and a second through conductor (no reference sign given). The second through conductor passes through a resin insulating layer 210 in the thickness direction to electrically connect, to one another, the second internal conductor layers positioned in different interlayer regions between the resin insulating layers 210, or to electrically connect the second internal conductor layer to the second joint conductor 221 or to the third joint conductor 223. A portion (end surface) of the second through conductor exposed at the fourth surface 202 can alternatively serve as the third joint conductor 223, without the third joint conductor 223 being provided on the fourth surface 202. In any case, the second circuit conductor 220 and the circuit conductor 2 are electrically connected to one another by the third joint conductor 223 and the joint conductor 21 of the circuit board 100 being connected to one another.

In addition, the second circuit conductor 220 (that is, the second joint conductor 221) of the second circuit board 200 is joined to the probe pin 400 to be electrically connected to the probe pin 400. Thus, the probe pin 400 is connected to the circuit conductor 2 of the circuit board 100, and the probe pin 400 is connected to a circuit of an inspection device via the external terminal 23 of the circuit conductor 2.

The second joint conductors 221 of the second circuit conductors 220 have a size and shape corresponding to the size and arrangement of the electrodes of the semiconductor devices on the wafer SW that is to be inspected, and the second joint conductors 221 of the second circuit conductors 220 are thus formed minute and have high density. On the other hand, the external terminals 23 of the circuit board 100 are large and have low density with respect to the size and arrangement of the joint conductors 21 so as to be connected to the circuit, of the inspection device, disposed with a common size and density. Thus, in the probe card substrate 300, the second circuit conductors 220 and the circuit conductors 2 are developed so that, for example, the sizes and spacing of the second circuit conductors 220 and the circuit conductors 2 increase from the third surface 201 of the second circuit board 200 (the upper surface of the probe card substrate 300) to the second surface 12 of the circuit board 100 (the lower surface of the probe card substrate 300).

Figure 13:
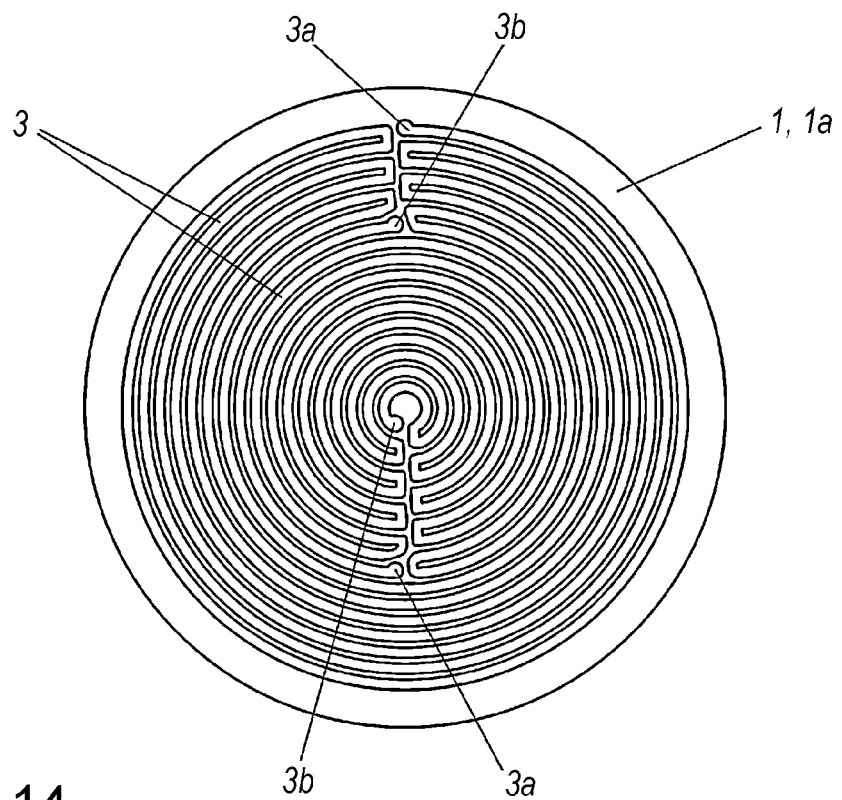
FIG. 13 is a plan view illustrating the inside of another example of the circuit board.
Figure 14:
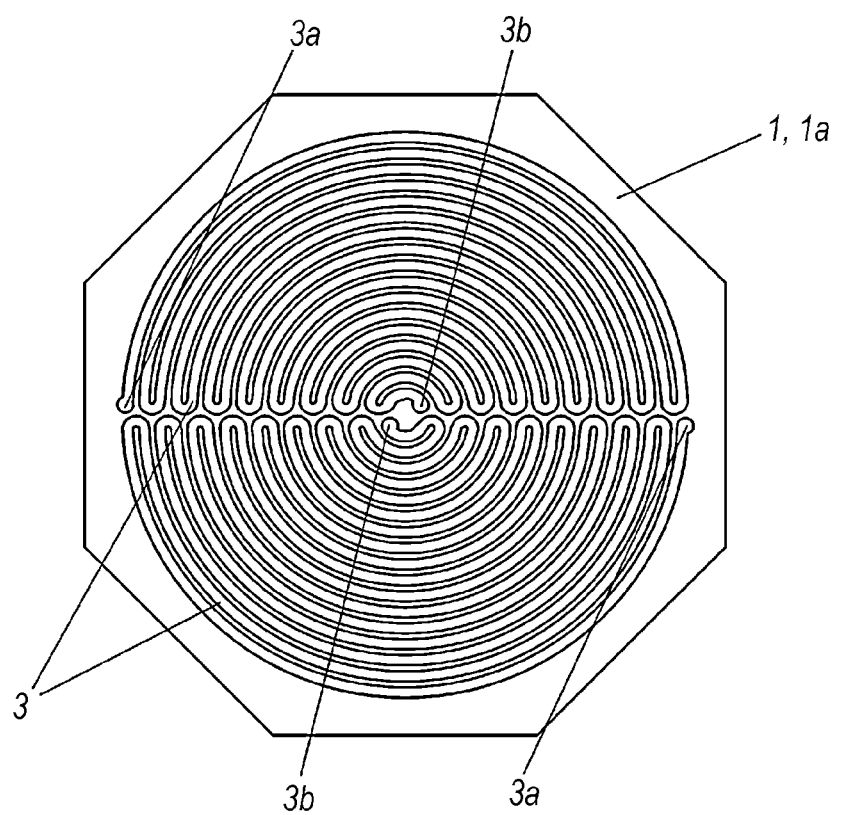
FIG. 14 is a plan view illustrating the inside of another example of the circuit board.

The shape in plan view of the circuit board 100 (that is, the insulating substrate 1) is an octagonal shape in the examples illustrated in FIG. 1A, FIG. 1B, FIG. 2, FIG. 14, and FIG. 15, a hexagonal shape in the example illustrated in FIG. 9, a quadrilateral shape in the example illustrated in FIG. 10, a decagonal shape in the example illustrated in FIG. 11, a dodecagonal shape in the example illustrated in FIG. 12, and a circular shape in the example illustrated in FIG. 13. As described above, the shape in plan view of the circuit board 100 is not particularly limited to a shape such as a polygonal shape or a circular shape and may be any shape on or in which the circuit conductor 2 and the heating wire 3 that have required sizes and shapes can be disposed. The second circuit board 200 provided on the circuit board 100 may have a shape and a size, in plan view, on or in which the second circuit conductors 220, which are developed between the circuit board 100 and the semiconductor wafer SW, can be disposed. As in the example illustrated in FIG. 17A and FIG. 17B, the circuit board 100 and the second circuit board 200 can have the same shape and size in plan view. At this point, the shape and size in plan view of the probe card substrate 300 are the same as the shape and size of the circuit board 100. The dimensions in plan view of the circuit board 100, the second circuit board 200, the probe card substrate 300, and the probe card 700 are set appropriately according to, for example, the dimensions, number, and arrangement of the semiconductor devices of the semiconductor wafer SW that is to be inspected.

The ceramic insulating layer 1*a* of the insulating substrate 1 is made of, for example, a ceramic sintered body such as an aluminum oxide sintered body, an aluminum nitride sintered body, a silicon carbide sintered body, a mullite sintered body, or a glass-ceramic. A mullite sintered body and some glass-ceramics have thermal expansion coefficients smaller than the thermal expansion coefficients of other ceramic sintered bodies described above and have thermal expansion coefficient close to the thermal expansion coefficient of the silicon of the substrate of the wafer SW that is to be inspected. Thus, when the circuit board 100 is used for an inspection as the probe card 700, between the electrode disposed on the wafer SW and the probe pin 400, misalignment to which the temperature of the environment during the inspection contributes hardly occurs. Thus, the probe card 700 is excellent in inspection accuracy. When an aluminum oxide sintered body, an aluminum nitride sintered body, and a silicon carbide sintered body are used, strength thereof and also thermal conductivity thereof are higher than those of a mullite sintered body and glass-ceramics, and the insulating substrate 1 has high rigidity and is excellent in thermal conduction of the heat generated at the heating wire 3 to the wafer SW.

When being made of, for example, an aluminum oxide sintered body, the insulating substrate 1 can be produced as follows. First, a raw material in powder form that mainly contains aluminum oxide powder and, for example, silicon oxide powder serving as a sintering aid component is mixed with an organic solvent and a binder, and slurry is formed. The slurry is shaped into a sheet shape by a shaping method such as the doctor blade method or the lip coater method, and a ceramic green sheet (hereinafter, also referred to as a green sheet) serving as the ceramic insulating layer 1*a* is prepared. Next, plural green sheets are layered on top of one another into a layered body. Subsequently, the layered body is fired at a temperature of about 1300° C. to 1600° C. to produce the insulating substrate 1.

The circuit conductor 2 contains, as a conductor component, a metallic material such as tungsten, molybdenum, manganese, or copper, or an alloy material containing a metallic material described above. For example, such a metallic material (alloy material) can be sintered at the same time as the firing of the ceramic green sheet and can be formed into a metallized conductor in the insulating substrate 1 and on a surface the insulating substrate 1. The circuit conductor 2 may contain an inorganic component such as glass or ceramics so as to increase, for example, sinterability or the joining strength with a ceramic material.

When being constituted by, for example, metallization layers of tungsten, the joint conductor 21 of the circuit conductor 2, the internal conductor layer 22*a* of the internal conductor 22, and the external terminal 23 can be formed as follows. For example, the joint conductor 21 of the circuit conductor 2, the internal conductor layer 22*a* of the internal conductor 22, and the external terminal 23 can be formed by a method in which metallic paste that is prepared by tungsten powder being mixed with an organic solvent and with an organic binder is printed onto the above-described green sheet serving as the ceramic insulating layer 1*a*, at a predetermined position, by a method such as a screen printing method, and the metallic paste is fired with the green sheet. In addition, the through conductor 22*b* of the internal conductor 22 can be formed by through holes being formed at predetermined positions in the green sheet and by the through holes being filled with metallic paste similar to the above-described metallic paste before the above-described printing of the metallic paste.

On the surfaces of exposed conductor layers as with the joint conductor 21 and the external terminal 23, a nickel film of about 1 to 10 μm in thickness and a gold film of about 0.1 to 3 μm in thickness are formed in turn, and it is thereby possible to protect the surfaces of the exposed conductor layers and to improve the joining property of, for example, a brazing material and solder. Such a nickel film and gold film can be formed by using a plating film formed by electrolytic plating or a thin film.

The joint conductor 21 can be formed by using such an above-described metallized conductor or can alternatively be formed by using a wiring layer of a thin-film conductor. The wiring layer of the thin-film conductor can be prepared, for example, as follows. First, by a thin-film forming method such as spattering, a joint metallic layer having a thickness of about 0.1 to 3 μm and made of a metal such as titanium or chromium is formed on the entire first surface 11 of the insulating substrate 1 having the internal conductor 22 and the external terminal 23 that are metallized conductors. Next, a main conductor layer having a thickness of about 2 to 10 μm and made of copper is formed on the entire surface of the joint metallic layer to form a conductive thin-film layer. A barrier layer, for example, may be formed as required. The joint conductor 21 in thin-film form can then be formed by the conductive thin-film layer being patterned by photolithography.

The first surface 11 of the insulating substrate 1 can be flattened by, for example, polishing, before the above-described thin-film joint conductor 21 is formed on the first surface 11 or before the second circuit board 200, which will be described later, is formed. Thus, the thin-film joint conductor 21, or the resin insulating layer 210 and the second circuit conductor 220 constituted by a thin-film conductor can accurately be formed.

The heating wire 3, the feeding conductor layer 41 and the feeding terminal 43 of the feeding conductors 4 can be made of metallization layers and formed by using a material and a method similar to those used for the joint conductor 21 of the circuit conductor 2, the internal conductor layer 22a of the internal conductor 22, and the external terminal 23. For example, metallic paste made by a high resistance component such as ceramic particles being added to the metallic paste used for the circuit conductor 2 can also be used as the metallic paste for the heating wire 3. The through holes 30 (the first through holes 31 and the second through holes 32) of the heating wire 3 can be set by using a screen pattern used when the green sheet is subjected to the screen printing. The feeding through conductor 42 of the feeding conductor 4 can be formed by using a material and a method similar to those used for the through conductor 22b of the internal conductor 22.

The second circuit board 200 has the plural resin insulating layers 210 (the resin insulating substrate) layered on one another as described above. The number and thickness of the resin insulating layers 210 are set according to, for example, the number of electrodes of the semiconductor devices to be inspected and are set so that the resin insulating layers 210 are connected to the circuit conductors 2 (the joint conductors 21) of the circuit board 100 to enable the circuit conductors 2 to develop.

The resin insulating layer 210 is made of an insulating resin such as a polyimide resin, a polyamide imide resin, a siloxane-modified polyamide imide resin, a siloxane-modified polyimide resin, a polyphenylene sulfide resin, a wholly aromatic polyester resin, a BCB (benzocyclobutene) resin, an epoxy resin, a bismaleimide triazine resin, a polyphenylene ether resin, a polyquinoline resin, and a fluorocarbon resin.

The resin insulating layer 210 may contain a filler for formability and for adjusting thermal expansion coefficient. Such a filler may be, for example, an inorganic filler such as barium sulfate, barium titanate, amorphous silica, crystalline silica, fused silica, spherical silica, talc, clay, magnesium carbonate, calcium carbonate, aluminum oxide, aluminum hydroxide, silicon nitride, aluminium nitride, boron nitride, alumina, magnesium oxide, magnesium hydroxide, titanium oxide, mica, Neuburger siliceous earth, organic bentonite, zirconium phosphate. Any one type of the above-described examples of the filler can be used alone, or two or more types of the filler examples can be appropriately combined to be used.

The resin insulating substrate can be prepared by a method in which the resin insulating substrate is formed by, for example, plural film-shape resin insulating layers 210 being layered and bonded. Another method can alternatively be employed. In the method, a liquid precursor resin is applied and hardened to form a resin insulating layer 210, on this resin insulating layer 210, another resin insulating layer 210 is formed by using the liquid precursor resin, and such a step is repeated. The method of layering the film-shape resin insulating layers 210 is more efficient.

Thin-film wiring layers such as the second joint conductor 221 of the second circuit conductor 220, the third joint conductor 223, and the second internal conductor layer of the second internal conductor 222, and the second through conductor of the second internal conductor 222 may be formed, for example, as follows. First, a resist film having openings corresponding to the second through conductor and thin-film wiring layer is formed on a resin layer serving as the resin insulating layer 210, and a recessed portion corresponding to the thin-film wiring layer and a through hole corresponding to the second through conductor are formed by etching or laser processing. Although such a recessed portion corresponding to the thin-film wiring layer is not necessarily required, the joining reliability between the thin-film wiring layer and the resin insulating layer 210 can be increased by the recessed portion being provided. Next, by a thin-film forming method such as a vapor deposition method, a sputtering method, or an ion plating method, an underlying conductor layer made of a chromium (Cr)-copper (Cu) alloy layer or a titanium (Ti)-copper (Cu) alloy layer, for example, is formed in each of the recessed portion and the through hole of the resin insulating layer 210. Next, by plating or other methods, the recessed portion and the through hole are filled with a metal, such as copper or gold, having a low electric resistance, and the resist is removed to form the second through conductor and the thin-film wiring layer.

On the surface of the second joint conductor 221 of the second circuit conductor 220, a nickel film of about 1 to 10 μm in thickness and a gold film of about 0.1 to 3 μm in thickness are formed in turn, and it is thereby possible to protect the surface of the second joint conductor 221 and to improve the joining property of, for example, a brazing material and solder. Such a nickel film and gold film can be formed by using a plating film formed by electrolytic plating or a thin film.

Examples of a method of forming the circuit board 100 and the second circuit board 200 into a layered structure include a method in which the second circuit board 200 that has been prepared in advance is bonded to the upper surface (the first surface 11) of the circuit board 100 and a method in which the resin insulating layers 210 are layered, one by one, on the upper surface (the first surface 11) of the circuit board 100. For the method in which the resin insulating layers 210 are layered one by one, there may be employed the above-described method using a film-shape resin or the above-described method using a liquid precursor resin. The method in which the second circuit board 200 is prepared in advance, and the plural resin insulating layers 210 (and the second circuit conductors 220) are bonded at once to the upper surface (the first surface 11) of the circuit board 100 is more efficient.

The probe pins 400 are attached to the second circuit conductors 220 (the second joint conductors 221) of the probe card substrate 300 that has been prepared as described above, and the probe card 700 is thus formed. The probe pins 400 are mechanically joined to and simultaneously electrically connected to the second joint conductors 221.

The probe pins 400 are made of a metal such as nickel or tungsten. When being made of nickel, the probe pins 400 are prepared, for example, as follows. First, female portions of plural probe pins are formed in a surface of a silicon substrate by etching. The female portions are arranged so as to correspond to the arrangement of the second joint conductors 221 of the probe card substrate 300. Next, a metal of nickel is deposited, by plating, on the surface of the silicon substrate in which the female portions are formed, and the female portions are further filled with the nickel. Other than the part of the nickel with which the female portions are filled, the nickel deposited on the upper surface of the silicon substrate is removed by processing such as etching to prepare the silicon substrate in which such nickel probe pins are embedded. The nickel probe pins embedded in the silicon substrate are joined to the second joint conductors 221 of the probe card substrate 300 by using a conductive joining material such as solder. The silicon substrate is then removed by using a potassium hydroxide aqueous solution, and the probe card 700 in which the probe pins 400 are joined to the second joint conductors 221 of the probe card substrate 300 is thus obtained.

The circuit board 100, the probe card substrate 300, and the probe card 700 of the present disclosure are not limited to the above-described specific examples and may be appropriately modified without departing from the spirit of the present invention.

REFERENCE SIGNS LIST 1 insulating substrate
11 first surface
12 second surface
1a ceramic insulating layer
2 circuit conductor
21 joint conductor
22 internal conductor
22a internal conductor layer
22b through conductor
23 external terminal
3 heating wire
3a, 3b end portion (of heating wire)
30 through hole
31 first through hole
32 second through hole
4 feeding conductor
41 feeding conductor layer
42 feeding through conductor
43 feeding terminal
100 circuit board
200 second circuit board
201 third surface
202 fourth surface
210 resin insulating layer
220 second circuit conductor
221 second joint conductor
222 second internal conductor
223 third joint conductor
300 probe card substrate
400 probe pin
700 probe card
SW semiconductor wafer (wafer)

The invention claimed is:

1. A circuit board comprising:
an insulating substrate formed by a plurality of ceramic insulating layers being layered on one another and having a first surface and a second surface on an opposite side to the first surface;
a plurality of circuit conductors passing through an inside of the insulating substrate and positioned in a region from the first surface to the second surface; and
at least one heating wire positioned in, among a plurality of interlayer regions between the ceramic insulating layers in the insulating substrate, at least one interlayer region between the ceramic insulating layers, wherein
the at least one heating wire has a mesh shape having a plurality of first through holes through which portions of the circuit conductors pass and having a plurality of second through holes through which the circuit conductors do not pass.

2. The circuit board according to claim 1, wherein
the at least one heating wire is formed spirally or concentrically in plan perspective and has a wire width larger than a distance between turns of the heating wire.

3. The circuit board according to claim 1, wherein
the at least one heating wire include multiple heating wires, and
the multiple heating wires are included in one of the interlayer regions between the ceramic insulating layers.

4. A probe card substrate comprising:
the circuit board according to claim 1; and a second circuit board positioned on the first surface of the circuit board and having a plurality of resin insulating layers and a second circuit conductor connected to a corresponding one of the circuit conductors.

5. A probe card comprising:
the probe card substrate according to claim 4; and a probe pin connected to the second circuit conductor.

6. The circuit board according to claim 2, wherein
the at least one heating wire include multiple heating wires, and
the multiple heating wires are included in one of the interlayer regions between the ceramic insulating layers.

7. A probe card substrate comprising:
the circuit board according to claim 2; and a second circuit board positioned on the first surface of the circuit board and having a plurality of resin insulating layers and a second circuit conductor connected to a corresponding one of the circuit conductors.

8. A probe card substrate comprising:
the circuit board according to claim 3; and a second circuit board positioned on the first surface of the circuit board and having a plurality of resin insulating layers and a second circuit conductor connected to a corresponding one of the circuit conductors.

9. A probe card substrate comprising:
the circuit board according to claim 6; and a second circuit board positioned on the first surface of the circuit board and having a plurality of resin insulating layers and a second circuit conductor connected to a corresponding one of the circuit conductors.

* * * * *